(12) United States Patent
Hardee

(10) Patent No.: US 6,195,302 B1
(45) Date of Patent: Feb. 27, 2001

(54) DUAL SLOPE SENSE CLOCK GENERATOR

(75) Inventor: Kim C. Hardee, Colorado Springs, CO (US)

(73) Assignee: United Memories, Inc., Colorado Springs, CO (US)

( * ) Notice: Subject to any disclaimer, the term of this patent is extended or adjusted under 35 U.S.C. 154(b) by 0 days.

(21) Appl. No.: 09/492,726

(22) Filed: Jan. 27, 2000

Related U.S. Application Data

(60) Provisional application No. 60/118,737, filed on Feb. 5, 1999.

(51) Int. Cl.$^7$ ...................................................... G11C 7/00
(52) U.S. Cl. .......................... 365/205; 365/149; 365/194; 327/51
(58) Field of Search .................................... 365/205, 207, 365/149, 194; 327/51, 57

(56) References Cited

U.S. PATENT DOCUMENTS

| | | |
|---|---|---|
| 5,140,199 | 8/1992 | Seo . |
| 5,280,450 | 1/1994 | Nakagome et al. . |
| 5,334,890 | 8/1994 | Hardee . |
| 5,574,681 | 11/1996 | Foss et al. . |
| 5,591,695 | * 1/1997 | Yim et al. ............................ 365/201 |
| 5,598,122 | 1/1997 | McClure . |
| 5,614,856 | 3/1997 | Wilson et al. . |
| 5,638,333 | * 6/1997 | Lee ....................................... 365/205 |
| 5,666,074 | 9/1997 | Chun . |
| 5,822,262 | 10/1998 | Hasimoto et al. . |

FOREIGN PATENT DOCUMENTS

WO 98/25272  6/1998  (WO) .

OTHER PUBLICATIONS

Changhyun, Kim, "Basic Dram Operation", Feb. 1998, Samsung Electronics.

\* cited by examiner

*Primary Examiner*—Huan Hoang
(74) *Attorney, Agent, or Firm*—Stuart T. Langley; William J. Kubida; Hogan & Hartson LLP

(57) ABSTRACT

A memory device including a plurality of sense amplifiers distributed about an integrated circuit chip, where each sense amplifier has a power node for receiving current. A conductor couples the power nodes of a number of sense amplifiers together. A low-impedance power supply conductor extends to each sense amplifier and a local drive transistor is provided for each sense amplifier. A timer unit generates an output signal controlling the local drive transistors. A first component within the timer unit causes the output to change from a first logic level towards a second logic level at a first rate while a second component within the timer unit causes the output to change at a second rate, wherein the second rate is greater than the first rate.

18 Claims, 4 Drawing Sheets

DUAL SLOPE SENSE CLOCK GENERATOR

This application claims the benefit of Provisional No. 60/118,737 filed Feb. 5, 1999.

BACKGROUND OF THE INVENTION

1. Field of the Invention

The present invention relates, in general, to integrated circuits and, more particularly, to sense amplifiers in integrated circuit memory devices.

2. Relevant Background

Semiconductor memory devices include sense amplifiers to sense weak signal levels from storage capacitors and amplify those weak signals to levels sufficient to drive other circuitry. Similar devices are used in other integrated circuit devices that sense, hold, and amplify signal levels. In a typical dynamic random access memory (DRAM) circuit, a data bit is stored as charge in a storage capacitor. A number of these storage capacitors are served by a single sense amplifier. During reading, writing, and refresh operations appropriate addressing signals are applied to couple one of the capacitors through a bit line to a latch node of the sense amplifier. Before accessing one of the capacitors, the bit lines are equalized to a selected precharge voltage during a precharge operation. The selected precharge voltage is usually a voltage midway between logic high level and a logic low level.

When an address-selected capacitor is coupled to one of the bit lines feeding into a sense amplifier the charge stored in the capacitor alters the signal on the bit line moving it incrementally towards either a logic high or a logic low level. Because it is desirable to make the storage capacitor as small as possible, the bit line may only move a few hundred millivolts or less from the equalization level. The sense amplifier serves to amplify this small signal level to drive the bit line to either a logic high or logic low voltage level depending on the direction in which the bit line moved with respect to the equalization level.

Sense amplifiers typically comprise a latch circuit formed, for example, by a pair of cross-coupled high gain inverters. A typical latch circuit has two latch nodes that each serve as a differential input coupled to sense a signal on the bit line during sensing to drive the bit line to the logic levels. It is desirable that sense amplifiers accurately sense the bit line signal and quickly set the latch outputs. During read operations, each latch output is coupled to a data input/output (I/O) line by a pass transistor as soon as the latched output is available. To reduce access time, it is desirable to activate the pass transistor as soon as possible after the latch output is stable. Also, it is desirable to make the pass transistor relatively large to couple the latched signal to the data line quickly and with little signal loss. However, to use a large pass transistor the latch must be strong in order to hold the latched signal when coupled to the parasitic load presented by the data lines.

The latches within the sense amplifiers typically comprise P-channel field effect transistors (FETs) coupled to a positive power supply such as $V_{DD}$ by a P-channel FET driver switch, also referred to as a "high-side" driver. Similarly, N-channel FETs in the latches are coupled to a relatively negative power supply (such as $V_{SS}$ or ground) using an N-channel driver switch, also referred to as a "low-side" driver. For convenience, the latch power supply nodes are designated herein as an LN node (i.e., a node coupling the low-side driver switch to the N-channel FET devices within the latch) and an LP node (i.e., a node coupling the P-channel FET devices within the latch to the high-side driver switch).

In a standby or precharge mode the driver switches are turned off so that the latch lacks sufficient power to drive a signal on the latch output nodes. In this standby mode, the latch input nodes follow the signal to be sensed. To read data from the memory cell, the driver transistors are turned on thereby enabling the latch to amplify the sensed signal on the bit lines and drive the latch output nodes to appropriate logic levels.

In DRAM devices, for example, rapid driver turn-on can cause the sense amp to latch to an incorrect state due to the effects of capacitance and transistor imbalances within the sense amplifier. During overly rapid turn on, parasitic coupling through transistors in each sense amplifier may pull both differential latch nodes of the sense amplifier toward either a logic HIGH or logic LOW depending on whether lower drive transistors or upper drive transistors turned on first. Because one of the drive transistors is typically implemented using N-channel devices and the other using P-channel devices, it is common that the N-channel side will turn on first. To counter this problem the driver transistors are desirably activated slowly during initial sensing to allow the sense amplifier to accurately latch the bit line value. However, after initial sensing has begun, the sense amps are preferably turned on hard to quickly amplify the differential voltage on the latch nodes (i.e., the bit lines) to minimize access time. This type of sensing is referred to herein as "dual-speed" sensing.

In many DRAM designs, the LN and LP nodes are shared among a plurality of sense amplifiers. These designs allow the driver switches to be implemented with large, low impedance switches. By low impedance it is meant that they are low impedance with respect to the transistors in the latch itself including pass transistors that couple the latch output nodes to the data line. These strong driver switches ensure that the sense amplifiers can be turned on hard when necessary. Dual-speed sensing is provided by implementing the driver switch with two or more transistors of different size. For example, a small transistor having high on-resistance is activated first to provide the initial sensing. After a preselected delay, a larger transistor having low on-resistance is activated to turn the latch devices on hard.

However, shared drivers result in long LN and LP lines in large memory devices such as 64 M, 256 M, and larger memory arrays. Parasitic impedance in the long lines results in voltage drops or sagging when a high current flows in the LN and/or LP lines. An example case is illustrated by a group of sense amplifiers sharing LN and LP lines, in which only one sense amplifier at the end of long LN and LP line is trying to sense a "0" and all other sense amplifiers are sensing a "1". When the sense amplifiers are simultaneously activated, the large number of sense amplifiers that are sensing a logic "1" will disturb the voltage at distant locations on the LN line. A sense amplifier that is coupled to that portion of the LN line will take longer to sense a logic "0". Hence, the sense amplifier performance is sensitive to the pattern of 1's and 0's stored in the memory. To accommodate this pattern sensitivity, the DRAM must be operated using access timing that will allow the slowest sense amplifier to accurately sense and drive the stored value regardless of the pattern. It is desirable to minimize pattern sensitivity to improve cell access speed.

To minimize pattern sensitivity, each sense amplifier may be provided with its own local driver transistors. In a typical memory device the power supply busses are distributed throughout the chip area. Each sense amplifier can be coupled to a nearby power supply bus using short, low impedance interconnect through a local drive transistor.

However, the local drive transistors must be significantly smaller than the shared drive transistors. These smaller drive transistors limit the sense amplifier's ability to drive the data I/O line. High switching current in the latch can destabilize the sense amplifier by allowing the LN and LP nodes to drift impermissibly far from the power supply bus voltages.

It is not practical to implement dual slop sensing using the dual transistor technique described above in a local drive transistor design because of the chip area consumed by two transistors required for each sense amplifier. Instead, dual speed sensing is provided with local drive switches by generating control signals to the driver transistors that settle temporarily at a level between a logic low (i.e., $V_{SS}$) and a logic high (i.e., $V_{DD}$). After a predetermined delay time, the control signals continue to the full logic levels to turn the driver transistors, and so the latch devices, on hard. This type of design is described in U.S. Pat. No. 5,334,890 titled "SENSE AMPLIFIER CLOCK DRIVER" issued Aug. 2, 1994 and incorporated herein by reference. This design distributes the driver transistors reducing pattern sensitivity. However, to provide sufficiently stable LN and LP nodes the control signals to the local drive transistors must have carefully controlled signal levels, timing, and slew. Hence, local driver designs require relatively complex control circuitry that increases the overall size overhead of the design to levels that may be inappropriate for some applications.

A need remains for a sense amplifier design and method for operating a sense amplifier that provides dual slope sensing and is compatible with large shared driver designs as well as local driver designs that offer pattern insensitivity. Moreover, a need exits for a high speed sense amplifier that can be implemented with simple, compact circuitry for high capacity memory designs.

SUMMARY OF THE INVENTION

The present invention involves a memory circuit having a plurality of sense amplifiers where each amplifier includes a power node for receiving current from a power supply. One or more driver switches couple each power node to a power supply bus node. The power nodes of a plurality of the plurality of sense amplifiers are coupled together to provide a shared power node. Pass transistors are used to couple output nodes of each of the plurality of sense amplifiers to data lines. A sense clock circuit provides a control signal to the one or more driver switches such that the control signal comprises an initial phase with a preselected initial rate of voltage change and a final phase with a rate of voltage change that is faster than the initial rate of change.

In another aspect the present invention involves a method for operating a memory device by generating a dual slope control signal for controlling the operation of sense amplifier driver transistors in an integrated circuit memory device. A sense amplifier drive transistor is provided having a control terminal coupled to receive the control signal and having a power node for supplying current to a preselected number of sense amplifiers. The control signal is placed at a level selected to turn off the driver transistors. A signal to be sensed is coupled to a latch node of the sense amplifier and charge is supplied from an external power supply to the sense amplifier driver transistor through a first impedance. After a delay, additional charge is supplied to the sense amplifier driver transistor through a second impedance at a second rate.

DETAILED DESCRIPTION OF THE PREFERRED EMBODIMENTS

The present invention involves a memory device having a sense amplifier with LN and LP nodes shared among a number of sense amplifiers. In one embodiment, local drive transistors (i.e., drive transistors associated with each sense amplifier) supply current to the shared LN and LP nodes. In an alternative embodiment, a single drive transistor is associated with each shared LN and LP node and drives current to the associated node. A timer circuit generates control or clock signals to the control electrodes of the local drive switches such that the control signal has a first phase with slow rate of change (e.g., dv/dt) and a final phase with higher rate of change. It is contemplated that more than two phases may be used, but it is significant that the initial phase allow for slow, gentle turn on while the sense amplifiers are sensing the stored signal and the final phase allows for rapid turn on to increase access speed.

In accordance with the local drive transistor implementation of the present invention, the drive transistors are distributed so that they are physically and electrically close to each sense amplifier providing improved pattern sensitivity in large memory devices. Also, shared LN and LP nodes enable the local drive transistors to operate cooperatively in parallel to provide a strong (i.e., low impedance) coupling between the sense amplifiers and the power supply nodes thereby enhancing sense amplifier stability and sensing speed.

Figure 1:
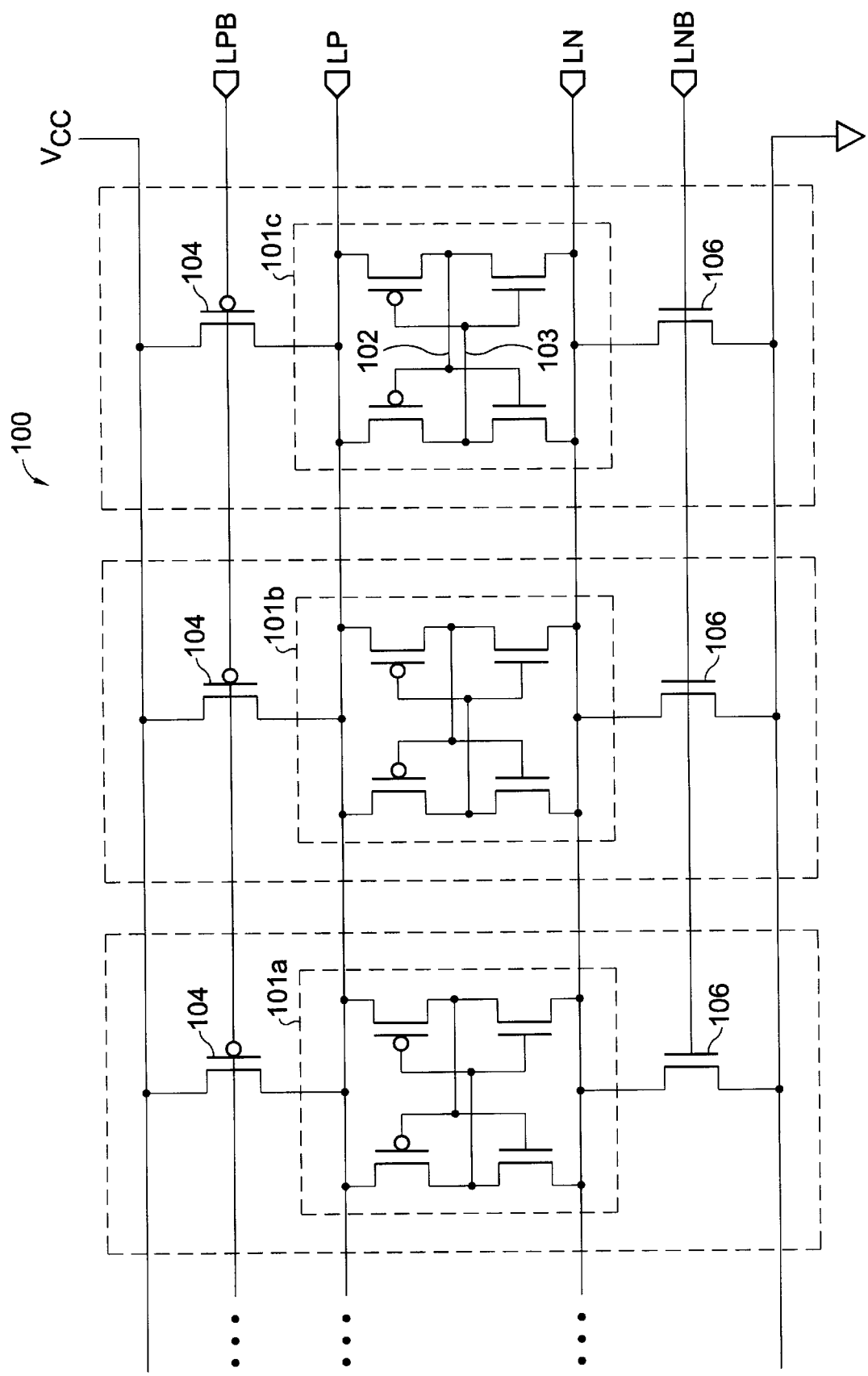
FIG. 1 shows a group of sense amplifiers in a memory circuit in accordance with the present invention.

FIG. 1 illustrates a portion of a memory device, shown generally at 100, in accordance with the present invention. A group of sense amplifiers 101a–101c are shown, but more or fewer sense amplifiers may be included in a group of sense amplifiers. Sense amplifiers 101a–101c include a pair of pchannel transistors and a pair of n-channel transistors. The gate electrode of one p-channel transistor is coupled to the gate electrode of one of the n-channel transistors to form a first latch node 102. The gate electrode of the other p-channel transistor is coupled to the gate electrode of the other n-channel transistor to form a second latch node 103. Additional circuitry that couples latch nodes 102 and 103 to bit lines and data I/O lines is described in greater detail with reference to FIG. 3. FIG. 1 illustrates the present invention embodied in a dynamic random access memory (DRAM). Other types of memory devices and integrated circuitry can, however, make use of the teachings of the present invention.

A significant feature in accordance with the present invention as shown in FIG. 1 is that local driver transistors 104 and 106 are provided for each sense amplifier 101a–101c, but the LN and LP nodes are also shared among a plurality of sense amplifiers 101a–101c. As described in greater detail hereinafter, a control signal (LPB) driving transistors 104 comprises a dual-slope signal. Similarly, a control signal (LNB) driving transistors 106 comprises a dual-slope signal. The configuration in accordance with the present invention allows the local driver transistors 104 and 106 to be small to reduce overall chip area. Yet, because local drive transistors 104 and 106 are coupled in parallel via the shared LN and LP nodes, they operate cooperatively to provide sufficient drive capacity to stabilize the LN and LP nodes during switching. This feature simplifies the requirements placed on the LNB and LNP signals resulting in simplified control circuitry (shown in FIG. 3).

Figure 2:
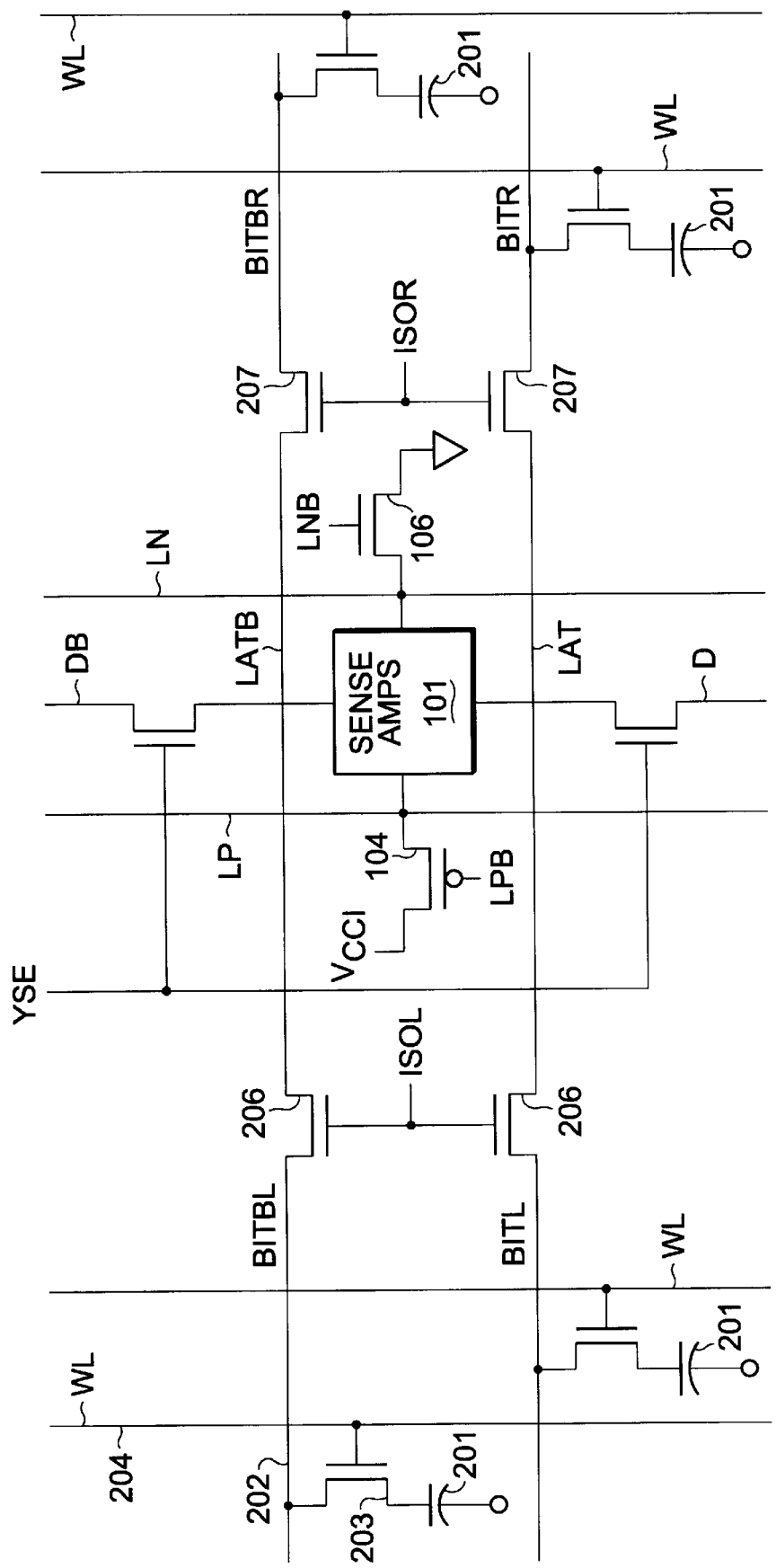
FIG. 2 illustrates in schematic diagram form a portion of a memory device including an embodiment in accordance with the present invention.

FIG. 2 shows a single sense amplifier 101 with associated circuitry typical in a DRAM application. Storage capacitors 201 are selectively coupled to bit lines 202 through access switches 203 in response to address signals supplied to word lines 204. In FIG. 2, signal lines are labeled with mnemonic labels to ease understanding. In general, an "R" suffix indicates a right-side signal line and an "L" suffix indicates a left-side signal line. Complementary signals are identified with a "B" (i.e., bar) suffix indicating that the signal is inverted. Word lines are identified as "WL", bit lines as "BIT", and latch nodes as "LAT". Operations described in terms of either a left side or right side components are readily implemented on the other side in a similar manner.

Just prior to a read operation, a pair of bit lines 202 such as left-side non-inverted bit line labeled BITL and inverting bit line BITLB are equalized at some voltage between a logic high and a logic low signal. In operation, when one word line 204 (labeled WL) is activated, a selected storage capacitor 201 is coupled to a bit line and incrementally moves the bit line to a relatively positive or relatively negative voltage depending on the stored charge. The terms "relatively positive" and "relatively negative" mean relative voltage levels with respect to the equalized voltage.

To access a storage capacitor 201 on the left side, left side bit lines BITBL and BITL are coupled to the latch nodes LATB and LAT through transistor 206 by activation of the isolation left (ISOL) signal line. Similarly, right side bit lines BITBR and BITR are coupled to latch nodes LATB and LAT through transistors 207 by activation of the isolation right (ISOR) signal line. In typical operation, once the ISOL or ISOR signal is set, the appropriate WL is activated to couple the storage capacitor 201 to the LAT or LATB node of sense amp 101.

Shortly after the WL signal is activated, the LPB signal is driven to a logic low coupling VCCI to sense amp 101 through drive transistor 104. Similarly, the LNB signal is driven high to couple sense amp 101 to ground or VSS through drive transistor 106. As described hereinbefore, LPB and LNB signals drive a number of transistors 104 and 106, respectively. Preferably, LNB and LPB are generated by a circuit such as that shown in FIG. 3 that generates LNB and LBP both as dual slope signals. Once sense amp 101 is powered the signals on LAT and LATB begin to separate under the influence of sense amp 101. As this separation occurs, the rate of change in the LNB and LPB signals (e.g., dv/dt) can increase to drive LAT and LATB quickly to the appropriate logic levels. The column select signal, labeled YSE in FIG. 2, is activated to couple the LAT and LATB signals to the data line (D) and inverted data line (DB) respectively.

Figure 3:
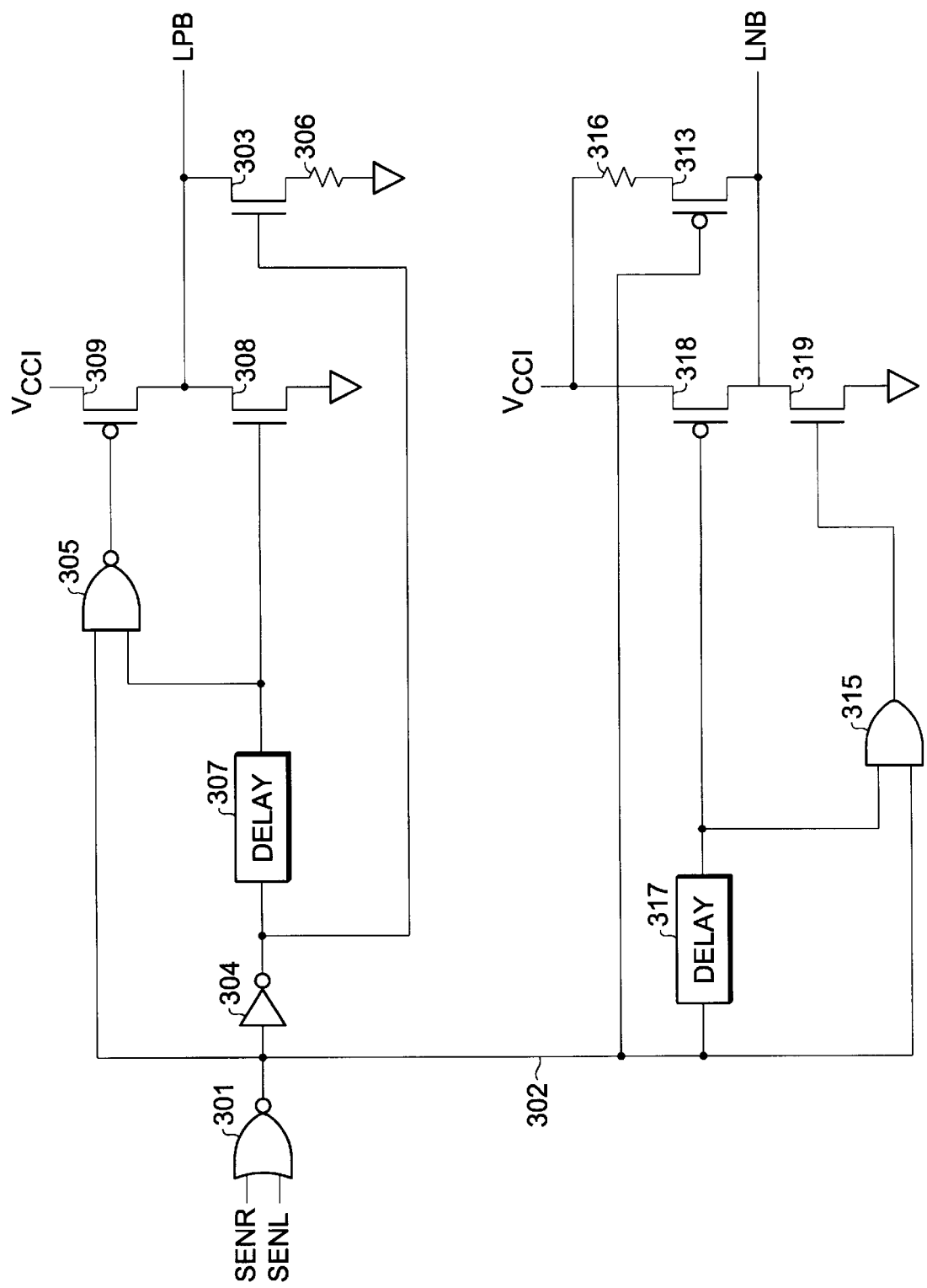
FIG. 3 shows a timer circuit generating clock signals in accordance with the present invention.

FIG. 3 shows in block diagram form a circuit useful in generating the dual slope LPB and LNB control signals described hereinbefore. As shown in FIG. 3, a sense right (SENR) or sense left (SENL) signal is applied to logic gate 301. Logic gate 301 is implemented as a NOR gate in the preferred embodiment, although other logic gates or a combination of logic gates may be convenient in other applications. Logic gate 301 logically combines the SENR and SENL signals to form an intermediate sense amplifier control signal on node 302.

In operation, one of the input signals SENR or SENL will go to a logic high when sensing is to begin and then goes to a logic low during precharge or standby mode. The SENR and SENL signals are derived from, for example, the row address strobe (RAS). During standby, when both SENR and SENL are low, the control signal on node 302 is a logic high. Soon after either SENR or SENL goes high, the signal on node 302 will transition to a logic low.

The signal on node 302 is inverted by inverter 304 and applied to the control node of transistor 303. Hence, shortly after either SENR or SENL goes high, transistor 303 is turned on pulling the LPB signal low through resister 306. Similarly, when the signal on node 302 goes low, transistor 313 is turned on pulling the LNB signal high through resistor 316. Resistor 316 controls the rate of change or dv/dt of LNB while resistor 306 controls the dv/dt of LPB.

After a delay determined by delay element 307, transistor 308 will be turned on pulling LPB to ground with a much lower resistance. When transistor 308 is turned on, LPB will fall to the ground voltage with a high dv/dt. Similarly, after a delay determined by delay unit 317, transistor 318 will be turned on to pull the LNB signal to VCCI rapidly without the dv/dt limiting effect of resistor 316 described hereinbefore.

In a typical application, transistor 308 will be sized much larger than transistor 303 and transistor 318 will be sized to be much larger than transistor 313. In the particular example, the second stage turn on initiated by transistors 308 and 318 is performed without any series impedance to limit the rate of signal change of LPB and LNB. There will be parasitic impedance in series with transistors 308 and 318, however, this parasitic impedance is preferably selected to be much less than the impedance provided by resistors 306 and 316. Alternatively, resistors 306 and 316 can be eliminated and rise time of the first and second stage controlled by relative transistor sizes. Also, it should be noted that during the second phase turn on with high dv/dt, both the first stage transistors 303 and 313 remain on in parallel with transistors 308 and 318. Hence, even if no resistance were provided and all of transistors 303, 313, 308, and 318 were similarly sized, the parallel combination of transistors in the second stage will result in higher dv/dt in accordance with the present invention. Each of these alternatives is equivalent to the specific implementation shown for purposes of the present invention.

The delayed signal from delay unit 307 is also coupled to one of the inputs of logic gate 305. The other input of logic gate 305 is coupled to node 302. The output of logic gate 305 controls transistor 309 to selectively couple VCCI to the LPB node. Likewise, node 302 is coupled to one of the inputs of logic gate 315, together with the delayed output from delay unit 317. The signal on node 302 will only be a logic high when both SENR and SENL are logic low. Hence, during a sense interval logic gate 305 will be such that its output is high maintaining transistor 309 in an off state. Logic gate 315 will be in a state such that its output is a logic low maintaining transistor 319 in an off state. When both SENR and SENL go low, transistors 309 and 319 turn on pulling LPB to VCCI and LNB to VSS or ground to deactivate sense amplifier 101 (shown in FIG. 1 and FIG. 2).

Figure 4:
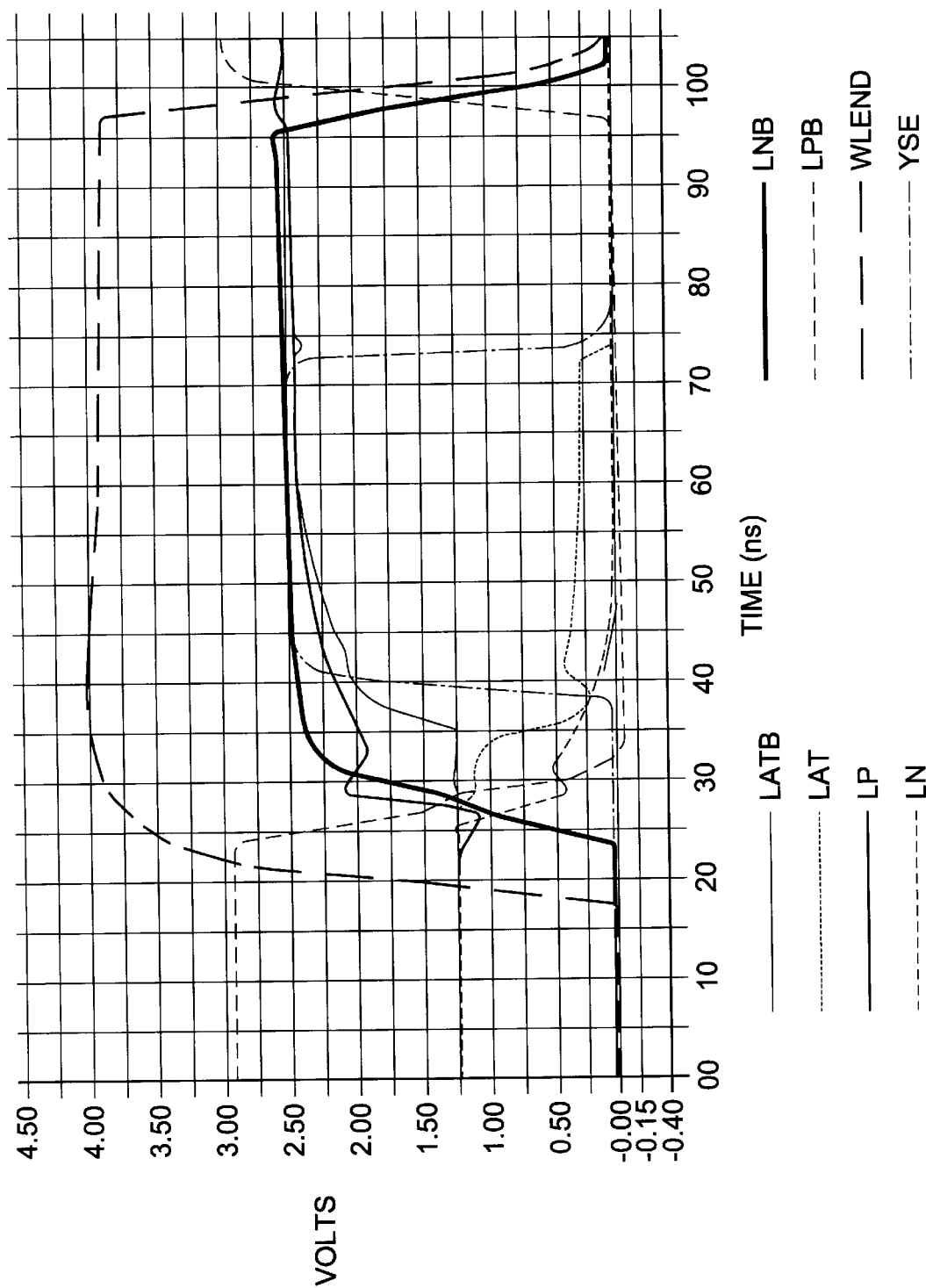
FIG. 4 illustrates waveforms resulting for an embodiment of the present invention.

FIG. 4 illustrates simulated wave forms generated by the circuit in accordance with the present invention. In FIG. 4, the vertical axis represents signal magnitude in volts while the horizontal axis represents time. The scale of the horizontal axis is in nanoseconds for purposes of understanding, however, it should be understood that the waveforms shown in FIG. 4 are more important for their relative rise and fall times and not for their absolute speed.

Starting at time 00, the initial standby state or precharge state is represented by the word line signal WLEND being at a logic low, and the SENL and SENR signals (shown in FIG. 3) are low. As described in reference to FIG. 3, the low SENL and SENR signals pull LPB to VCCI (i.e., logic high) and LNB to logic low. The column select signal YSE is also low isolating LAT and LATB nodes from the data lines D and DB. LN and LP are held at an intermediate precharge level in the standby state. The sense amplifier latch nodes LAT and LATB are also precharged at a level between logic low and logic high.

As sensing operation begins at about the time labeled 20 in FIG. 4, word line WLEND goes to a logic high to couple a selected storage capacitor 201 to a bit line. The isolation signals ISOL and ISOR shown in FIG. 2 operate in a conventional manner and are not illustrated in FIG. 4. As shown in FIG. 4, word line WLEND is actually overdriven above VCCI to rapidly charge the long word lines in a typical DRAM circuit, although the exact voltage may vary from application-to-application.

Shortly after the word line is activated, it can be seen that at least one of the LAT and LATB nodes begin to differentiate from the precharge level. While both LAT and LATB will eventually separate from the precharge level as they are complementary signals, one or the other will change first depending on which line is coupled to a storage capacitor. During this time period, the turn on of sense amplifier 101 is critical as overly fast turn on may overdrive the LAT and LATB signals producing incorrect results. For example, referring to FIG. 1, during overly rapid turn on parasitic coupling through the transistors in each sense amplifier 101b may pull both latch nodes 102 and 103 toward the potential of either LN or LP depending on whether lower drive transistors 106 or upper drive transistors 104 turned on first. Such action places the sense amplifier in an indeterminate or metastable state from which it may not recover the correct data value.

As shown in FIG. 4, just before time 25, the LPB signal begins to fall at a first dv/dt during a first phase of the sense amplifier turn on. During this initial phase, the LNB signal also begins to rise at a first dv/dt. At about time 30, the LATB and LAT signals have sufficiently separated such that the drive transistors (104 and 106 in FIG. 2) can be turned on hard. Hence, at this time a second phase of the sense amplifier turn on begins wherein the dv/dt of the LNB and LPB signals is increased to drive the signals rapidly to the logic levels.

As LNB and LPB approach their respective logic levels, LN and LP separate from the precharge level thereby turning on sense amplifier 101. As described hereinbefore, LN and LP are shared nodes so that each local drive transistor 104 and 106 actually is coupled to multiple sense amplifiers. The number of drive transistors coupled in parallel by each LN and LP node is selected to provide sufficient combined current drive capacity such that the LP and LN nodes do not sag or droop outside of their defined logic ranges as the sense amplifier latch nodes LAT and LATB are loaded by the data lines D and DB during operation. As shown in FIG. 4, LAT and LATB continue to separate and are driven to the appropriate logic levels quickly after LN and LP are activated.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed. In particular, although the preferred implementation uses local drive transistors in combination with shared LN and LP nodes, it is contemplated that the dual-slope clock signal generating component in accordance with the present invention can be used with either a shared or "lumped" drive transistor or with local drive transistors without shared LN and LP nodes. These and other modifications in accordance with the present invention are within the scope and spirit of the present invention as hereinafter claimed.

I claim:

1. A memory device comprising:
   a plurality of sense amplifiers distributed about an integrated circuit chip, each sense amplifier having a power node for receiving current;
   a low-impedance power supply conductor;
   at least one drive transistor having a first current carrying electrode coupled to the power supply conductor, a second current carrying electrode coupled to the power nodes of a preselected number of the sense amplifiers, and a control electrode;
   a control line coupled to the control electrode;
   a timer unit having an output coupled to the control electrode and generating a control signal;
   a first component within the timer unit causing the control signal to change from a first logic level towards a second logic level at a first rate; and
   a second component within the timer unit causing the control signal to change to the second logic level at a second rate, wherein the second rate is greater than the first rate such that the first component and the second component are concurrently activated to cumulatively affect the rate of change to the second logic level.

2. The memory device of claim 1 further comprising a conductor coupling the power nodes of a number of sense amplifiers.

3. The memory device of claim 2 wherein the at least one drive transistor is provided for each sense amplifier.

4. The memory device of claim 2 wherein the at least one drive transistor comprises a drive transistor that is shared by each of the number of sense amplifiers coupled to the conductor.

5. The memory device of claim 2 wherein each sense amplifier receives current from more than one drive transistor.

6. The memory device of claim 1 further comprising:
   a data line;
   a latch node in the sense amplifier to hold a signal generated by the sense amplifier; and
   a pass transistor coupled between the latch node and the data line.

7. The memory device of claim 6 wherein the number of power nodes coupled together by the conductor is selected to provide a combined drive capability sufficient to drive the data line when the pass transistor is turned on without the signal generated by the sense amplifier drooping outside of specified logic levels ranges.

8. The memory device of claim 1 wherein the first component in the timer unit further comprises:
   a sense control signal node receiving an externally generated sense control signal indicating when sensing is to occur;
   a first switch having current carrying electrodes coupled to drive the timer unit output to a selected logic level through a first impedance, the first switch controllably coupled to the sense control signal node;

a delay unit coupled to the sense control signal node and generating a delayed sense control signal; and a second switch having current carrying electrodes coupled to drive the timer unit output to the selected logic level through a second impedance, the second switch controllably coupled to the delayed sense control signal.

9. The memory device of claim 8 wherein the second impedance is less than the first impedance.

10. A sense amplifier clock driver circuit for an integrated circuit memory, the driver circuit providing at least one clock signal for controlling the operation of sense amplifier driver transistors and comprising:

a sense control signal node receiving an externally generated sense control signal indicating when sensing is to occur;

a first impedance having a terminal coupled to a selected logic level signal;

a first switch having current carrying electrodes coupled to drive the clock signal to a selected logic level through the first impedance, the first switch controlled by the sense control signal;

a delay unit coupled to the sense control signal node and generating a delayed sense control signal a second impedance having a terminal coupled to the selected logic level signal; and a second switch having current carrying electrodes coupled to drive the clock signal to the selected logic level through the second impedance, the second switch controlled by the delayed sense control signal such that the first switch and the second switch are concurrently activated after the delayed sense control signal is generated.

11. The clock driver circuit of claim 10 wherein the second impedance is less than the first impedance.

12. The clock driver circuit of claim 10 wherein the first switch and the second switch are coupled to drive the timer unit output in parallel.

13. The clock driver circuit of claim 10, the driver circuit providing a second clock signal for controlling the operation of the sense amplifier driver transistors, the clock driver circuit further comprising:

a third impedance having a terminal coupled to a second logic level signal;

a third switch having current carrying electrodes coupled to drive the clock signal to the second logic level through the third impedance, the third switch controlled by the sense control signal a fourth impedance having a terminal coupled to the second logic level signal; and a fourth switch having current carrying electrodes coupled to drive the second clock signal to the second logic level through the fourth impedance, the second switch controlled by the delayed sense control signal.

14. A method for generating a control signal for controlling the operation of sense amplifier driver transistors in an integrated circuit memory device comprising:

providing a sense amplifier drive transistor having a control terminal coupled to receive the control signal and having a power node for supplying current to a preselected number of sense amplifiers;

placing the control signal at a level selected to turn off the driver transistors;

coupling a signal to be sensed to a latch node of the sense amplifier;

supplying the charge from an external power supply to the sense amplifier driver transistor through a first impedance at a first rate; and after a delay, supplying charge to the sense amplifier driver transistor through a second impedance at a second rate in addition to continuing to supply charge through the first impedance.

15. The method of claim 14 wherein the first rate is less than the second rate.

16. The method of claim 14 wherein before coupling the signal to be sensed to a latch node the method further comprises precharging the latch node to a selected intermediate voltage between a logic high and a logic low.

17. The method of claim 16 wherein the second rate is selected to rapidly provide low impedance paths to the external power supply after initial sensing.

18. The method of claim 14 further comprising while changing the magnitude of the control signal at a second rate coupling the sense amplifier latch node to a data line using a pass transistor.

\* \* \* \* \*